(12) United States Patent
Huang

(10) Patent No.: US 12,278,642 B2
(45) Date of Patent: Apr. 15, 2025

(54) CLOCK SYNCHRONIZATION

(71) Applicant: NXP USA, Inc., Austin, TX (US)

(72) Inventor: Ya-Wei Huang, Milpitas, CA (US)

(73) Assignee: NXP USA, Inc., Austin, TX (US)

( * ) Notice: Subject to any disclaimer, the term of this patent is extended or adjusted under 35 U.S.C. 154(b) by 98 days.

(21) Appl. No.: 17/992,852

(22) Filed: Nov. 22, 2022

(65) Prior Publication Data
US 2024/0171185 A1 May 23, 2024

(51) Int. Cl.
| | | |
|---|---|---|
| H03L 7/195 | (2006.01) | |
| H03L 7/23 | (2006.01) | |
| H03L 7/24 | (2006.01) | |

(52) U.S. Cl.
CPC .............. H03L 7/195 (2013.01); H03L 7/23 (2013.01); H03L 7/24 (2013.01)

(58) Field of Classification Search
CPC ... H03L 7/195; H03L 7/23; H03L 7/24; H04L 7/02; H04L 7/0016; H04L 27/266; H04L 27/2659; H04L 27/0014; H04L 27/2657; H04L 7/0331; H04L 27/2662; H04L 27/2675; H04L 2027/0067; H04L 7/033; H04L 2027/003; H04L 7/0012; H04L 7/0087; H04L 2027/0026; H04L 2027/0065
See application file for complete search history.

(56) References Cited

U.S. PATENT DOCUMENTS

| | | | | |
|---|---|---|---|---|
| 2008/0049847 | A1* | 2/2008 | Telang | H04B 10/25133 375/242 |
| 2017/0324419 | A1* | 11/2017 | Mayer | H03L 7/0891 |
| 2021/0067313 | A1* | 3/2021 | Yu | H04J 3/0685 |

OTHER PUBLICATIONS

Dong, Meng et al. "The Design and Implementation of IEEE 1588v2 Clock Synchronization System by Generating Hardware Timestamps in MAC Layer", IEEE, (2018), 5 pages.

* cited by examiner

Primary Examiner — John W Poos

(57) ABSTRACT

A time-synchronization apparatus and/or method involves identifying a frequency offset by implementing a frequency-offset-acquisition process which includes counting cycles of a local clock signal within a period of a reference pulse train. A phase offset of the local clock signal is determined, a residual frequency error is generated based on the phase offset, and at least one timer-adjustment signal that is based on the frequency offset and the residual frequency error is provided.

17 Claims, 7 Drawing Sheets

CLOCK SYNCHRONIZATION

FIELD OF THE INVENTION

The present invention pertains, among other things, to systems, methods, apparatuses and techniques for clock synchronization, and it is particularly applicable to clock synchronization between two different devices that are wirelessly connected to each other.

BACKGROUND

The following discussion concerns certain background information related to the present invention. However, it should be understood that only knowledge clearly, explicitly and specifically described herein as being "conventional" or "prior art" is intended to be characterized as such. Everything else should be understood as knowledge and/or insight originating from the present inventor.

As devices become more complex, various protocols are being adopted for time measurement and synchronization. Precise Time Protocol (PTP) hardware clocks and IEEE 802.11v hardware timestamping are the two mature techniques to improve system internal synchronization and wireless time measurement. New and nonobvious improvements to such conventional architectures are now discussed.

SUMMARY OF THE INVENTION

One embodiment of the invention is directed to a time-synchronization apparatus that includes inputs for receiving a reference pulse train and a local clock signal. A frequency offset acquisition and compensation (FOAC) module is configured to identify a frequency offset by implementing a frequency-offset-acquisition process which includes counting cycles of the local clock signal within a period of the reference pulse train. In addition, a joint phase and residual frequency offset tracking (JPRFOT) module is configured to determine a phase offset of the local clock signal, output the phase offset, generate a residual frequency error based on the phase offset, and provide the residual frequency error to the FOAC module. The FOAC module is further configured to generate at least one timer-adjustment signal based on the frequency offset and the residual frequency error and output the at least one timer-adjustment signal.

Another embodiment is directed to a time-synchronization method that includes counting cycles of a local clock signal within a period of a reference pulse train, determining a phase offset of the local clock signal, generating a residual frequency error based on the phase offset, and providing at least one timer-adjustment signal that is based on the frequency offset and the residual frequency error.

Certain more-specific implementations of either of the foregoing embodiment(s) include one or any combination of the following features.

The phase offset of the local clock signal is determined in reference to a second reference pulse train.

The second reference pulse train has a frequency of at least 10 times the frequency of the reference pulse train.

The second reference pulse train has a frequency of at least 100 times the frequency of the reference pulse train.

The phase offset is determined by measuring a timing differential between an expected time and a current measured time, and wherein the expected time is equal to a sum of a previous time and an amount of time that should have elapsed since the previous time based on a period of the second reference pulse train.

The frequency-offset-acquisition process comprises counting cycles of the local clock signal within different periods of the reference pulse train until a stable-frequency-offset criterion is satisfied.

The stable-frequency-offset criterion comprises a condition that detected frequency offsets determined from two consecutive detections are identical.

Upon satisfaction of the stable-frequency-offset criterion, the frequency-offset-acquisition process is halted, and a resulting stabilized frequency offset is used as the frequency offset thereafter.

Also included is an adaptive timer module that receives the phase offset and the at least one timer-adjustment signal and modifies its output based on such phase offset and such at least one timer-adjustment signal.

The adaptive timer module is configured to add a specified number of nanoseconds within a period when appropriate and to subtract a specified number of nanoseconds within a period when appropriate, in response to the phase offset and the at least one timer-adjustment signal.

Also included is a step of modifying an output of an adaptive timer based on the phase offset and the at least one timer-adjustment signal.

The modifying step comprises adding a single count within a local clock cycle when appropriate and subtracting a single count within a local clock cycle when appropriate, in response to the phase offset and the at least one timer-adjustment signal.

The foregoing summary is intended merely to provide a brief description of certain aspects of the invention. A more complete understanding of the invention can be obtained by referring to the claims and the following detailed description of the preferred embodiments in connection with the accompanying figures.

BRIEF DESCRIPTION OF THE DRAWINGS

In the following disclosure, the invention is described with reference to the accompanying drawings. However, it should be understood that the drawings merely depict certain representative and/or exemplary embodiments and features of the present invention and are not intended to limit the scope of the invention in any manner. The following is a brief description of each of the accompanying drawings.

DESCRIPTION OF THE PREFERRED EMBODIMENT(S)

For ease of reference, the present disclosure is divided into sections. The general subject matter of each section is indicated by that section's heading. However, such headings are included simply for the purpose of facilitating readability and are not intended to limit the scope of the invention in any manner whatsoever.

Initially, it is noted that the present disclosure is related to, and in several respects builds upon, Applicant's U.S. Patent Application Publication No. 2021/0067313 (the '7313 Application), which application is incorporated by reference herein as though set forth herein in full. Aspects of (as well as considerations pertaining to) systems, components and process steps discussed in the '7313 Application also can apply to corresponding systems, components and process steps discussed herein, although the various improvements to such systems, components and process steps discussed herein generally are preferred.

In one respect, the present invention provides a unified implementation of hardware clocks to handle both PTP and IEEE802.11v protocols, which is feasible to deal with high-resolution adjustment and design complexity. In order to synchronize absolute time on different devices, a system in accordance with the preferred embodiments of the present invention considers, not only the time difference between two devices, but also the time synchronization between different subsystems within the same device. More preferably, a cross-domain adaptive timer according to the present invention is a hardware solution timer, e.g., to provide real-time synchronization across subsystem devices, as well as to wireless local area network (WLAN), e.g., Wi-Fi, devices. The embodiments described herein primarily relate to Wi-Fi; however, it should be understood that the same structures, methods and concepts also apply to systems that use any other kind of WLAN, and any reference to Wi-Fi herein can read be replaced by the more generic term WLAN.

The preferred unified-adaptive PTP hardware clock (PHC) uses joint frequency acquisition and phase tracking to provide both subsystem timer and wireless timestamping. The adaptive timer preferably possesses the capability of managing adjustments for both nanosecond-based counters and clock-cycle-based counters. Thus, with the configuration of frequency and phase offset compensation, the adaptive timer, including both nanosecond and clock-cycle counters, typically can provide accurate Epoch time for use in system internal synchronization and wireless time management.

Figure 1:
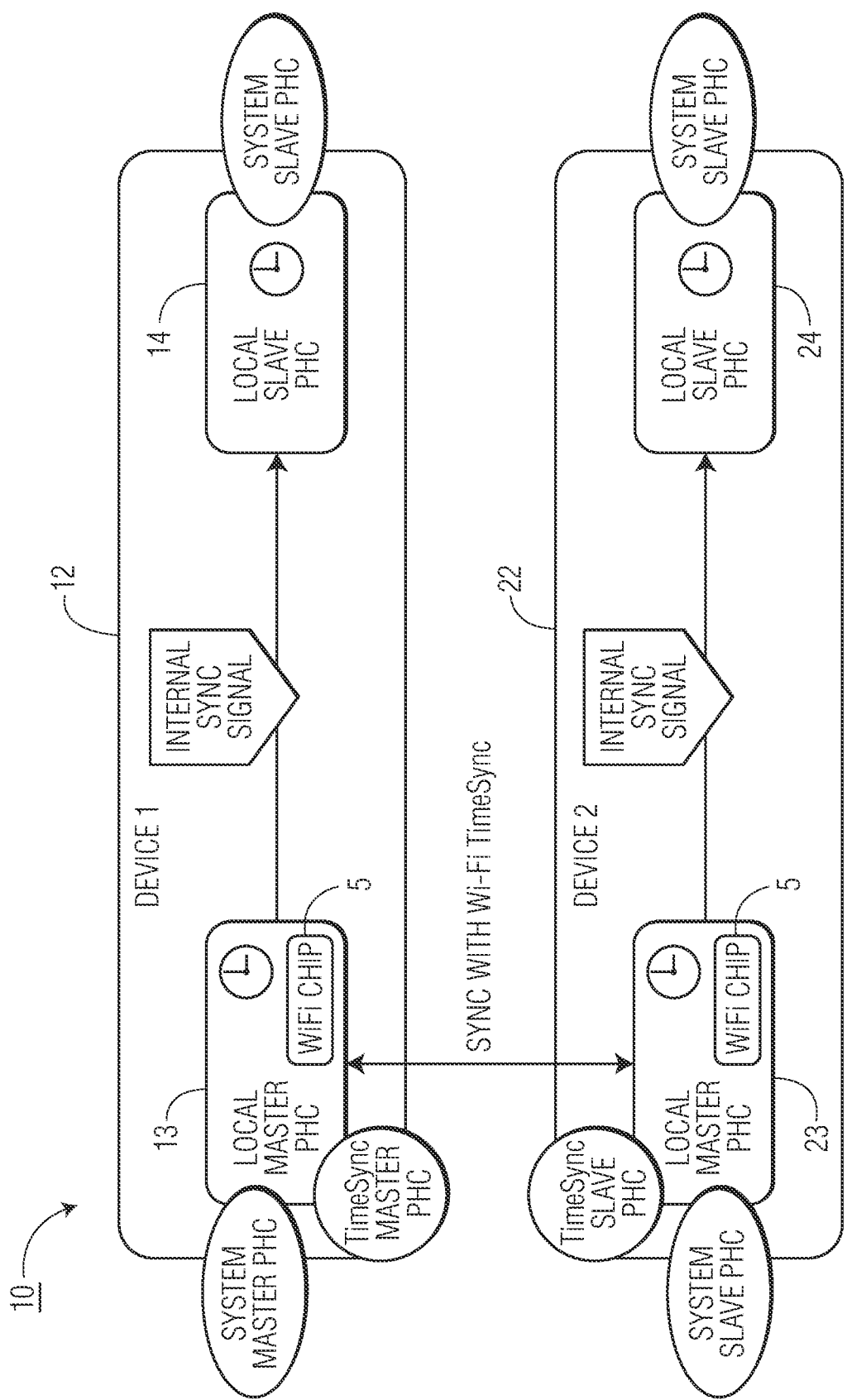
FIG. 1 is a simplified or high-level block diagram of a clock synchronization system according to a representative embodiment of the present invention, in which Wi-Fi sync chips are used within PHCs that function as local masters.

FIG. 1 illustrates an embodiment of a system 10 in accordance with the present invention. In system 10, two separate devices 12 and 22 are in wireless (e.g., Wi-Fi, in this specific example) communication with each other. Device 12 has a PHC 13, which is part of one subsystem of device 12 and functions as a local master, and a PHC 14, which is part of another subsystem of device 12 and functions as a local slave. Similarly, device 22 has a PHC 23, which is part of one subsystem of device 22 and functions as a local master, and a PHC 24, which is part of another subsystem of device 22 and functions as a local slave. In a slightly altered embodiment, PHCs 13 and 14 are parts of different devices (rather than just different subsystems), but still communicate with each other via physical connection(s), and/or PHCs 23 and 24 are parts of different devices (rather than just different subsystems), but still communicate with each other via physical connection(s) (e.g., can be considered to be part of a single physically connected system). In any event, each of PHCs 13 and 23 (the local masters) includes a Wi-Fi chip 5 according to the present invention (discussed in greater detail below), configured such that PHC 13 functions as a TimeSync Master and PHC 23 functions as a TimeSync Slave. As a result of this configuration, PHC 13 functions as the overall master PHC for system 10, and each of the other PHCs 14, 23 and 24 function as system slaves.

Figure 2:
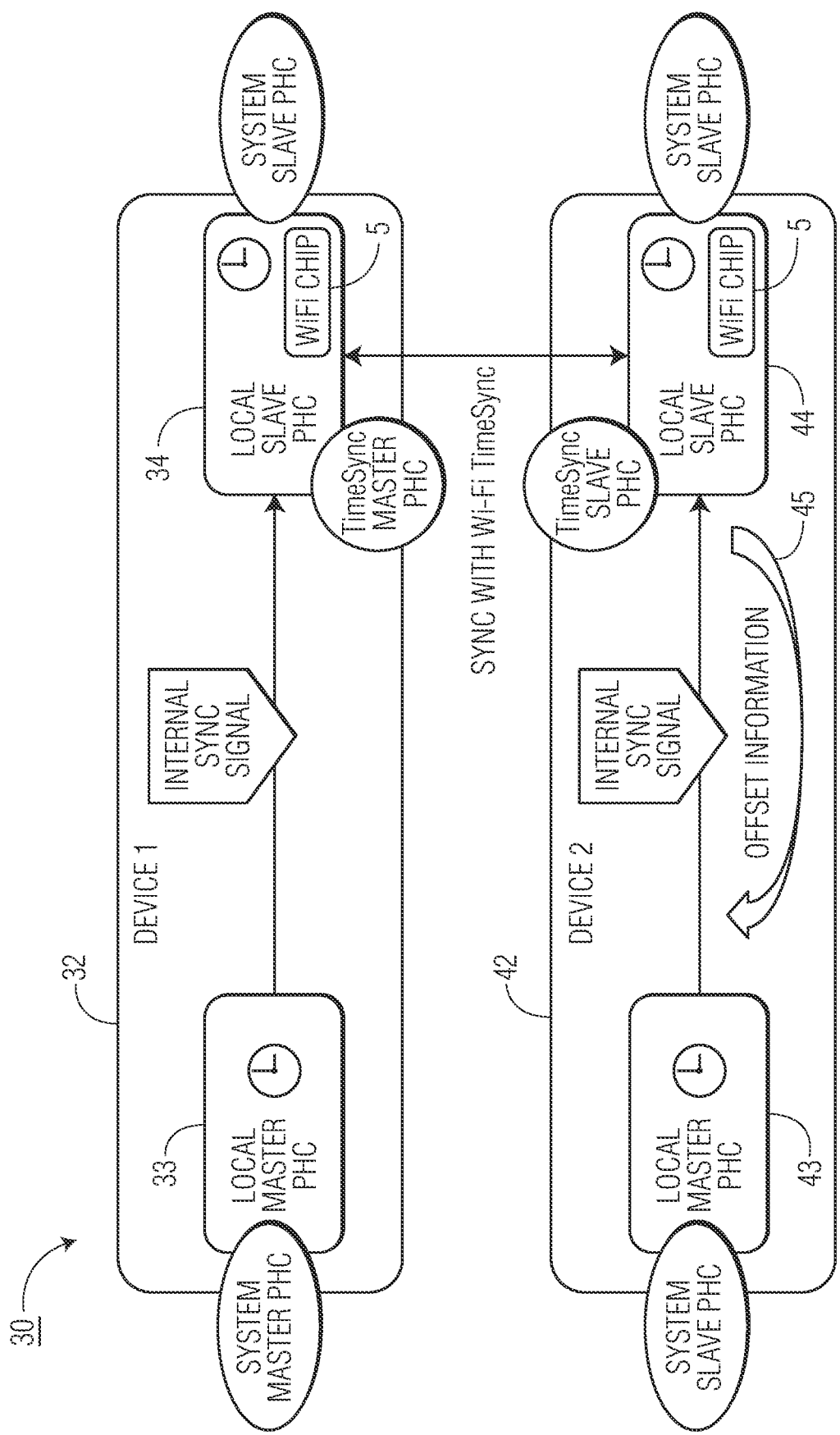
FIG. 2 is a simplified or high-level block diagram of a clock synchronization system according to a representative embodiment of the present invention, in which Wi-Fi sync chips are used within PHCs that function as local slaves.

FIG. 2 illustrates a system 30 according to an alternate embodiment of the present invention. In system 30, two separate devices 32 and 42 are in wireless (e.g., Wi-Fi, in this specific example) communication with each other. Device 32 has a PHC 33, which is part of one subsystem of device 32 and functions as a local master, and a PHC 34, which is part of another subsystem of device 32 and functions as a local slave. Similarly, device 42 has a PHC 43, which is part of one subsystem of device 42 and functions as a local master, and a PHC 44, which is part of another subsystem of device 42 and functions as a local slave. Again, in a slightly altered embodiment, PHCs 43 and 44 are parts of different devices (rather than just different subsystems), but still communicate with each other via physical connection(s), and/or PHCs 43 and 44 are parts of different devices (rather than just different subsystems), but still communicate with each other via physical connection(s) (e.g., can be considered to be part of a single physically connected system). In any event, in system 30 (unlike system 10), each of PHCs 34 and 44 (the local slaves) includes a Wi-Fi chip 5 according to the present invention (discussed in greater detail below), configured such that PHC 34 functions as a TimeSync Master and PHC 44 functions as a TimeSync Slave. As a result of this configuration, PHC 33 functions as the overall master PHC for system 30, and each of the other PHCs 34, 43 and 44 function as system slaves. Because PHC 44 synchronizes to (i.e., receives synchronization information from) PHC 34, PHC 44 provide the corresponding offset information 45 back to its local master PHC 43.

Generally speaking, with reference to FIGS. 1 and 2, in the currently preferred embodiments, a system according to the present invention (e.g., system 10 or 30, respectively) uses a Wi-Fi sync chip 5 in each of two different Wi-Fi connected devices (e.g., devices 12 and 22 or devices 32 and 42, respectively). The Wi-Fi sync chips 5 synchronize the clocks of such two different devices. This synchronization process preferably has two main aspects, as follows:

1. Device-to-device time synchronization. The 802.11v TM frames carry timestamp information to support a PHC operating as a TimeSync Master (e.g., PHC 13 or PHC 34) or a TimeSync Slave (e.g., PHC 23 or PHC 44).
2. System-internal time synchronization. To synchronize an external clock which is part of the same device but in a different subsystem, each PHC is configured to act as a System Master (e.g., PHC 13 or PHC 33) or a System Slave (e.g., PHCs 14, 23 and 24 or PHCs 34, 43 and 44). The System Master PHC generates specific sync/control pulses to other subsystems. Each System Slave PHC, on the other hand, handles sync-up processing according to the pulses from other subsystems and can generate specific pulses to other subsystems.

By using Wi-Fi sync chips 5, cross-domain time synchronization is completed in real time instead of processing wireless timestamping and local synchronization separately.

Figure 3:
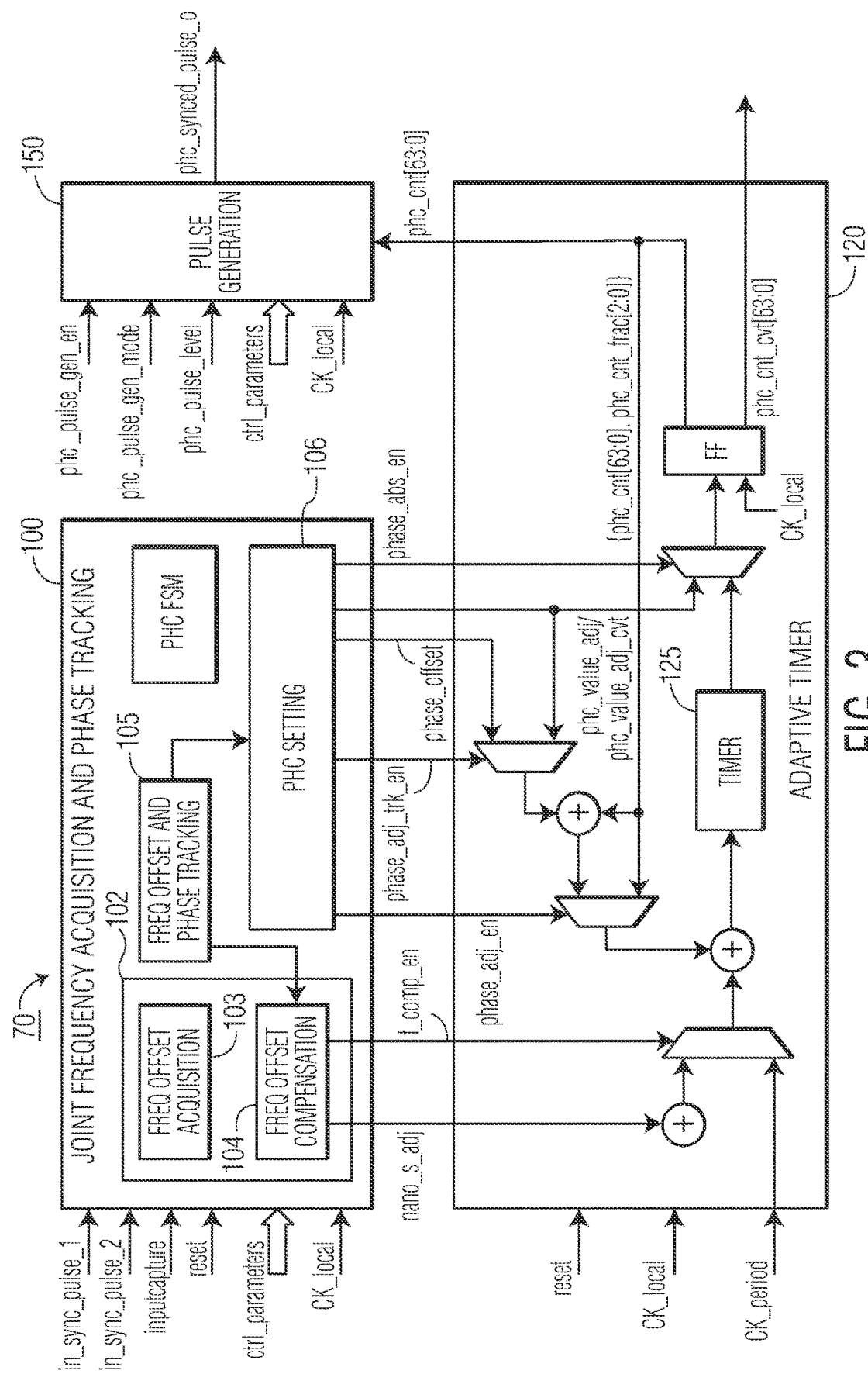
FIG. 3 is a simplified or high-level block diagram of a portion of a Wi-Fi sync chip according to a representative embodiment of the present invention.

FIG. 3 is a simplified or high-level block diagram of synchronization circuitry 70 within Wi-Fi sync chip 5. As shown, synchronization circuitry 70 primarily includes three main modules: a joint frequency acquisition and phase tracking module 100, an adaptive timer module 120 (preferably, implemented as a unified-adaptive PHC), and a pulse generation module 150. The following is a brief summary of the signals input into and the signals output from synchronization circuitry 70 in the present embodiment. Preferably, one of the ctrl parameters instructs whether the current devices to function as a master or a slave.

TABLE I

Description of input/output (I/O) signals

| Signal name | I/O | Description |
| --- | --- | --- |
| CK_local | I | Main (local) clock signal |
| CK_period | I | Period of main clock |
| ctrl_parameter | I | Initial settings or control signals from MAC or SoC |
| in_sync_pulse_1 | I | Input periodic pulse train at: 1 Hz (1 PPS), 2 Hz, and 10 Hz. |
| in_sync_pulse_2 | I | Input periodic pulse train at: 1 kHz, 4 kHz, and 10 kHz. |
| inputcapture | I | Used as synchronization signal to sample PHC value |
| phc_cnt_cvt | O | Adjusted clock-cycle-based count |
| phc_pulse_gen_en | I | Enable pulse generation |
| phc_pulse_gen_mode | I | Definitions of pulse mode to be generated |
| phc_pulse_level | I | Definitions of output of Sole mode to be generated |
| phc_synced_pulse_o | O | Output pulse signals |
| reset | I | Active high reset signal |

The preferred embodiments use two reference pulse signals (in_sync_pulse_1 and in_sync_pulse_2) having different frequencies. More preferably, in_sync_pulse_2 has a significantly higher frequency than in_sync_pulse_1, e.g., as indicated in Table I above.

In order to satisfy the requirements of the PTP and IEEE 802.11v protocols, an integrated counter, preferably implemented as a Unified-Adaptive PTP Hardware Counter (or Unified-Adaptive PHC) in adaptive timer module 120, is a timer core that mainly supports a nanosecond-based adjustable counter (phc_cnt) and a clock-cycle-based counter (phc_cnt_cvt) with unified adjustment. Using signals from the joint frequency acquisition and phase tracking module 100, it is able to distinguish the behavior of master and slave mode and maintain various types of offset compensation according to frequency offset detection, coherent tracking, and initial settings. The cooperation between adaptive timer module 120 and joint frequency acquisition and phase tracking module 100 preferably results in the prevention of system disorders that would occur if the timer were to experience big jumps. In addition, the two pulse trains (i.e., in_sync_pulse_1 and in_sync_pulse_2), which preferably are selectable to be references for frequency acquisition and/or phase tracking, can be provided with different pulse periods (or, correspondingly, frequencies), thereby allowing a trade-off between flexibility and accuracy. More preferably, the adaptive timer module 120 provides real-time adjustments across nano-second-based counter to clock-cycle-based counter without any (or any significant) accuracy loss. Finally, pulse generation module 150 generates and outputs sync-up signals at various pulse widths and frequencies to facilitate system internal synchronization, based on input(s) (e.g., phc_cnt) from the nanosecond-based adaptive timer module 120, allowing the current device to function as a master (either the overall system master or a local master, e.g., if the current devices they slave to another higher-level device but is also acting as a master to one or more lower-level devices.

Initially, it is noted that in_sync_pulse_1 and in_sync_pulse_2 are the two periodic reference-pulse signals, preferably having different frequencies and having been received from the same (e.g., master) device. Although two such pulse signals are used in the preferred embodiments of the present invention, alternate embodiments use just a single pulse signal as a reference for both frequency tracking and phase tracking.

Figure 4:
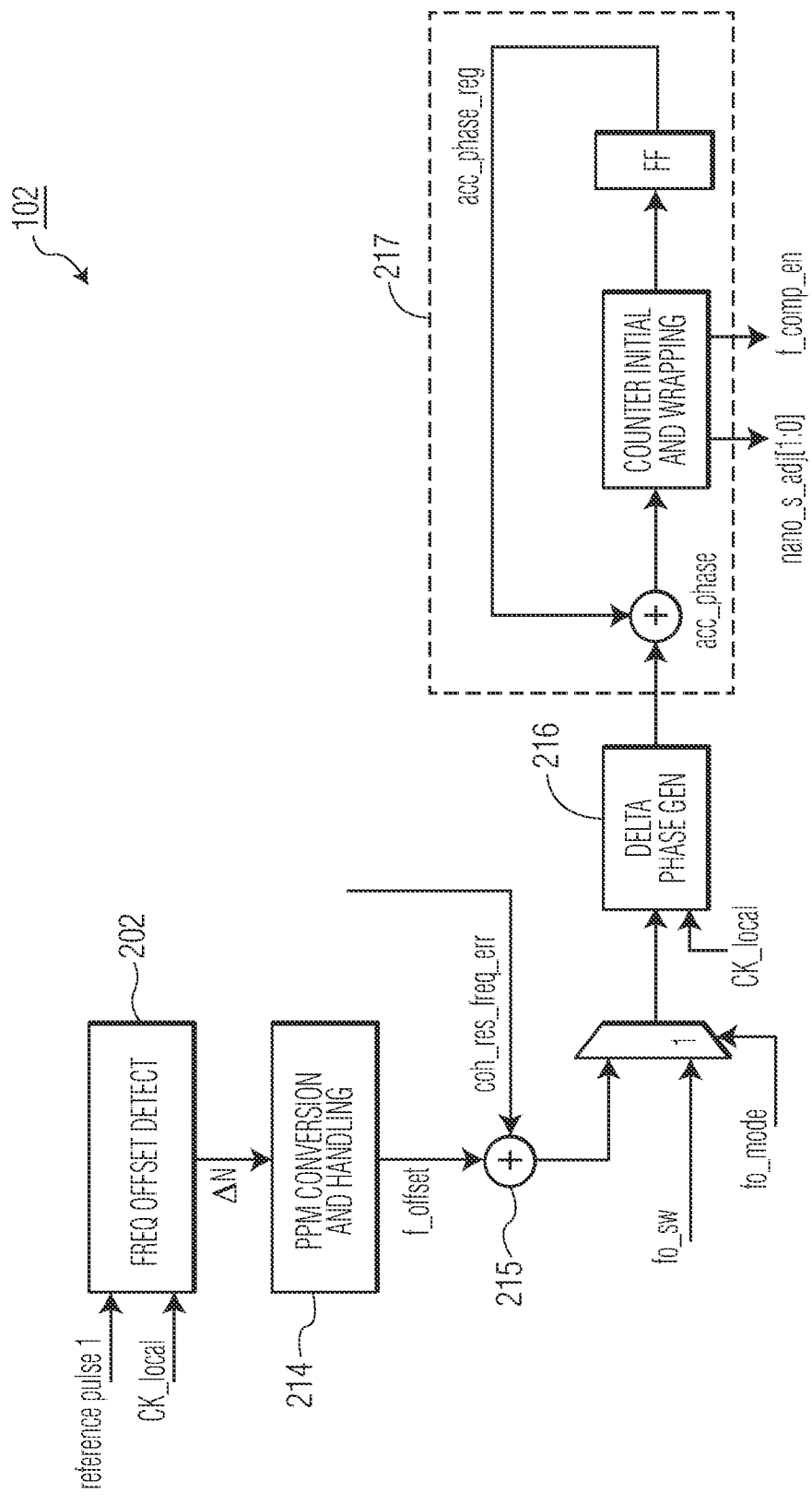
FIG. 4 is a block diagram illustrating frequency offset acquisition and compensation.

FIG. 4 is a block diagram of the frequency offset acquisition and compensation (FOAC) module 102 of joint frequency acquisition and phase tracking module 100. When the Wi-Fi sync chip 5 is configured to function as a slave timer, the frequency offset acquisition functionality 103 (within FOAC 102) and, more specifically, the frequency offset detection module 202 within FOAC 102, detects frequency offset of the local clock signal CK_local with the aid of reference signal 1 (e.g., relatively low-frequency pulse signal in_sync_pulse_1, in the current embodiment) and thereby determines the average timing drift that would occur absent correction.

Figure 5:
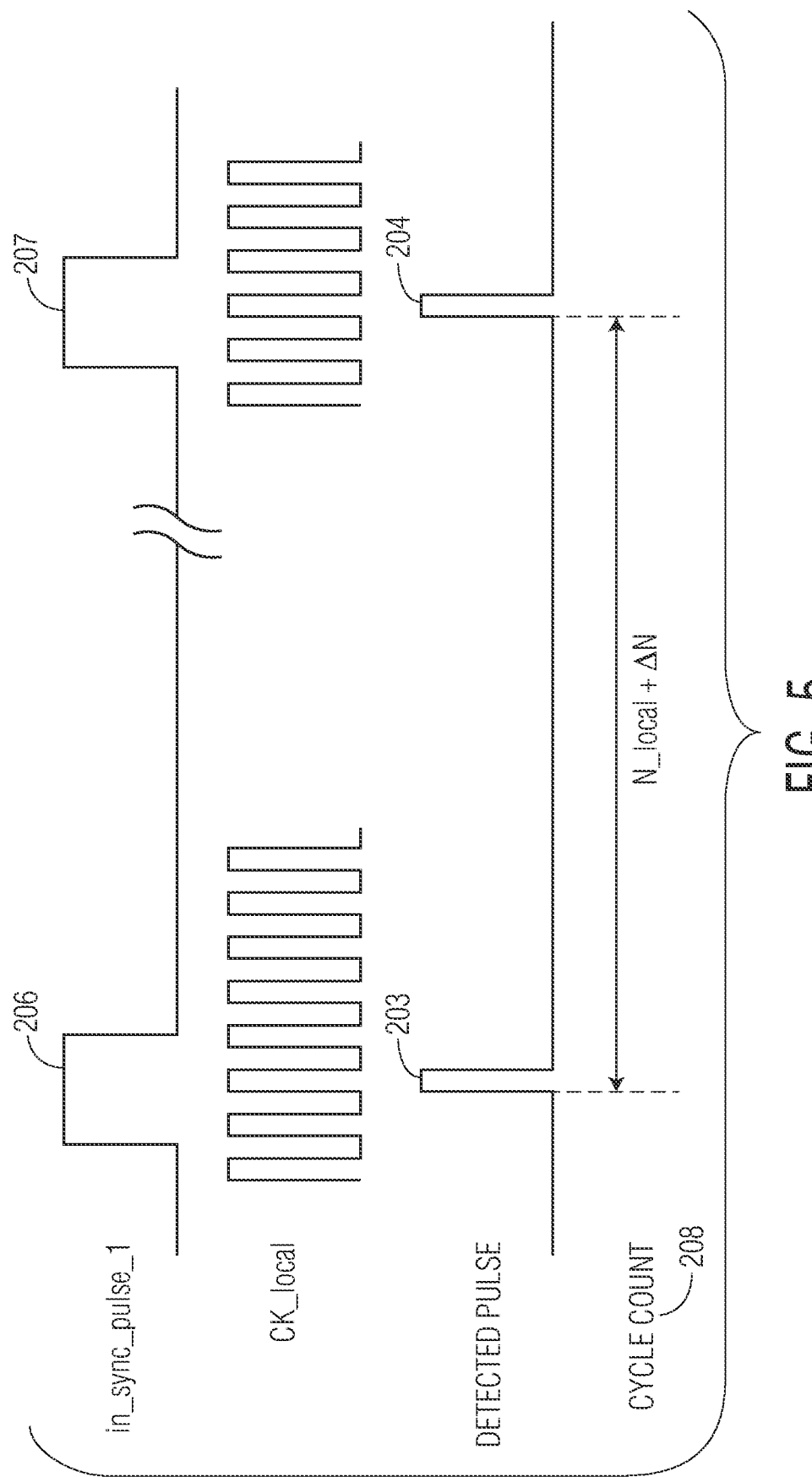
FIG. 5 is a timing diagram illustrating pulse detection and frequency-offset detection.

FIG. 5 illustrates this processing (performed by frequency offset detection module 202 in the current embodiment), which generally is similar to the corresponding processing discussed in the '7313 Application. As shown, a specific time point (referred to as a detected pulse, e.g., detected pulse 203 or 204) is first detected for two pulses (e.g., pulses 206 and 207, respectively) of in_sync_pulse_1 (e.g., at the centers of pulses 206 and 207 in the current embodiment). Then, the measured total count 208 of CK_local cycles between the two consecutive detected pulses 203 and 204 of in_sync_pulse_1 is determined. That value can be considered to be the sum of two components: N_local+ΔN, where N_local is the ideal or expected reference count of cycles of CK_local within a single period of in_sync_pulse_1, based on the period of in_sync_pulse_1 and the frequency of CK_local, and ΔN is the additional actual count. Thus, ΔN indicates a time drift between the master and slave devices (i.e., with in_sync_pulse_1 having been generated using the master device's clock).

Referring back to FIG. 4, the measurement of ΔN is converted into a frequency offset (f_offset) in PPM units, represented in the current embodiment as a S(10.2) value, i.e., a 10-bit signed value with 2 fractional bits, in PPM conversion and handling module 214. To stabilize frequency offset acquisition, PPM conversion and handling module 214 preferably converges such frequency offset to a final value within a few reference pulses of frequency offset detection (i.e., a few pulses of in_sync_pulse_1). In the preferred embodiments, the frequency offset acquisition functionality 103 preferably stops when a specified criterion indicates that a stable frequency offset has been identified. In the current embodiment, that stable-frequency-offset criterion is that the detected frequency offsets determined from two consecutive detections (i.e., from two consecutive periods of in_sync_pulse_1 in the current embodiment) are found to be identical. In any event, once the specified stable-frequency-offset criterion has been satisfied, the identified frequency offset preferably is used until the frequency offset acquisition functionality 103 is once again initiated (e.g., as discussed below).

As discussed above, using in_sync_pulse_1, ongoing timing drift (i.e., timing offsets that accrue at a constant rate over time) due to any clock frequency differential is determined. Subsequently, frequency offset compensation (such as is illustrated in the drawings) is able to smoothly compensate most of such time drifting with small (e.g., periodic) steps. Any remaining time drifting is fairly small after such frequency-offset compensation. However, over a long enough period of time, large time gaps can occur. To address this issue, systems according to the present invention employ joint tracking, by monitoring phase offset and/or drifting, as well as the foregoing frequency offset.

Figure 6:
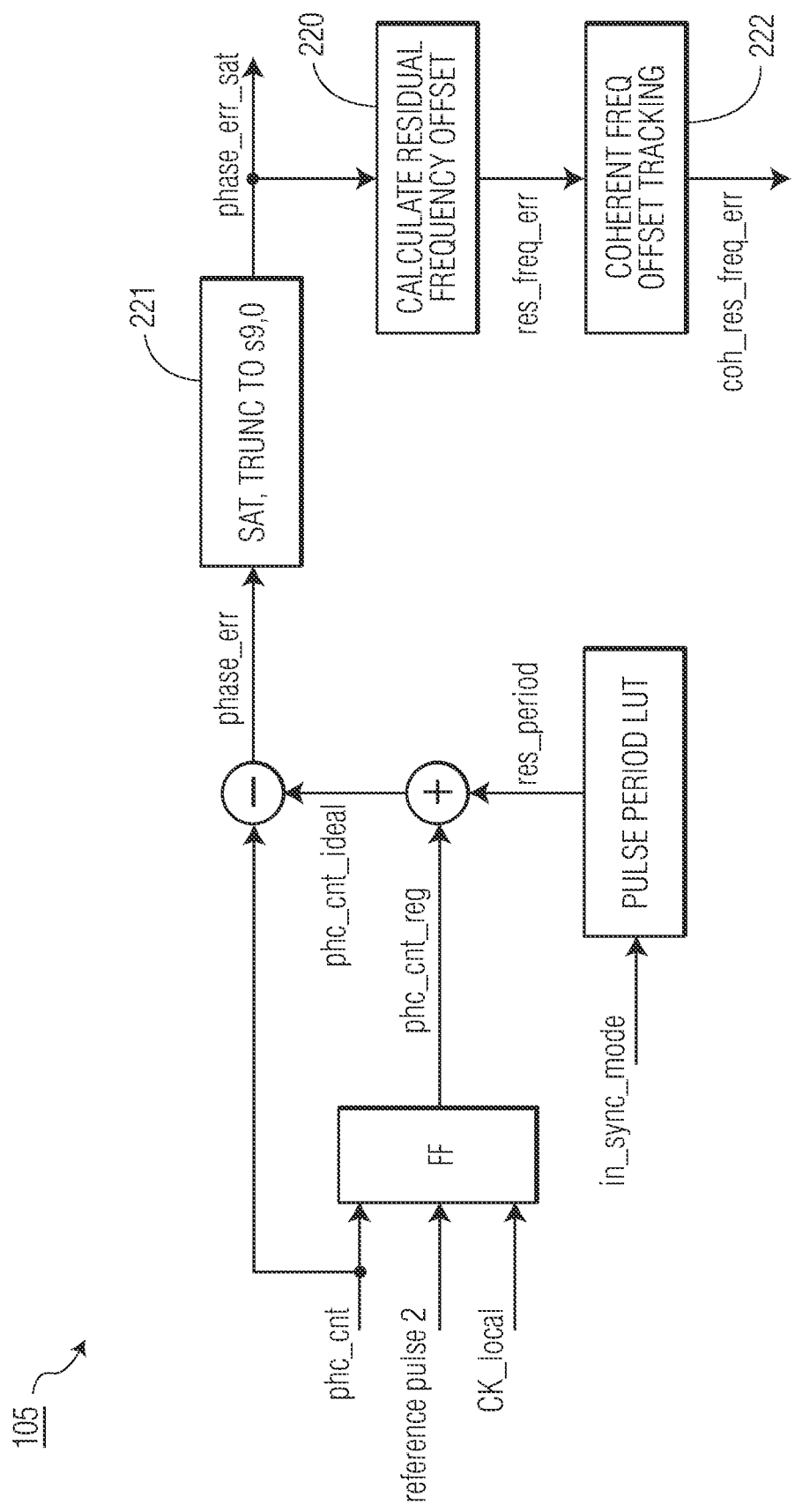
FIG. 6 is a block diagram illustrating joint phase and residual frequency offset tracking.

Therefore, preferably at the same time frequency offset is being determined using in_sync_pulse_1, phase offset is determined based on in_sync_pulse_2. More specifically, in the current embodiment, phase tracking uses reference pulse 2 (in_sync_pulse_2) to calculate the time difference between a targeted time and the current local time, where (in the current embodiment) the targeted time is the sum of the previous local time (i.e., the local time as of the previous detected pulse of reference pulse 2) and the period of reference pulse 2. This difference is denoted as phase_err (phase error) in FIG. 6, which shows joint phase and residual frequency offset tracking (JPRFOT) module 105 in greater detail.

Time synchronization is then fine-tuned by applying the phase error to the timer 125. More specifically, in the current embodiment, phase_err_sat (which is phase_err as saturated in module 221) is provided to the PHC setting module 106, which then outputs it as the signal phase offset. In addition, PHC setting module 106 preferably also outputs a number of control signals, such as: phase_adj_en which controls whether to use the calculated phase error, phase_adj_trk_en which controls when to turn on phase tracking, phc_value_adj/phc_value_adj_cvt which is an override phase adjustment value provided by the user, and phase_abs_en which controls when to use the override phase adjustment value (e.g., upon initialization).

Simultaneously, the identified phase error is used to calculate residual frequency offset (res_freq_err) in corresponding module 220 of JPRFOT module 105. More specifically, in the current embodiment, such calculation is based on phase_err_sat and the period of reference pulse 2 (ref_period) as follows:

res_freq_err=−phase_err_sat/(ref_period*10^6);//S (10.2) ppm

This res_freq_err value is then accumulated over multiple cycles of reference pulse 2 in coherent frequency offset tracking module 222 (shown in FIG. 6) to provide coh_res_freq_err, which in turn is then provided to FOAC module 102, e.g., as shown in FIG. 4, for use in calibration of frequency offset acquisition functionality 103.

Specifically, in the current embodiment, a variation flag signal within coherent frequency offset tracking module 222 rises to "high" if the absolute value of accumulative residual frequency offset is larger than a specified threshold, which is half of the minimum PPM in the current embodiment (i.e., larger than a magnitude of 0.25/2=0.125 in the current embodiment) during a period of reference pulse 1, and otherwise it is "low". Once this variation flag is asserted, the coherent residual frequency error is sufficient to add the minimum PPM (+/−0.25 in the current embodiment), where the sign depends upon the accumulative residual frequency offset, so that value is then output as coh_res_freq_err by coherent frequency offset tracking module 222. In the event the detected phase error reaches a specified maximum phase-error threshold (in the present embodiment, if phase_err_sat overflows its assigned 9 bits), the entire system preferably resets, and, e.g., the functionality of FOAC module 102 is reinitiated.

Afterwards, the frequency offset compensation functionality 104 of FOAC 102 outputs fixed (e.g., 1-nanosecond increments in the current embodiment in which timer 125 has a 1-nanosecond period) phase adjustments (nano_s_adj), along with a control signal (f_comp_en), which is issued periodically, in order to instruct when to apply such adjustments, thereby enabling incremental offset compensation, i.e., to compensate for the timing drift which otherwise would occur as a result of variation in the local clock speed (i.e., variation in the frequency of CK_local). Specifically, as shown in FIG. 4, FOAC module 102 first combines the calculated frequency offset (f_offset) with the accumulated residual frequency offset (coh_res_freq_err) within adder 215, calculates the phase drift resulting from such combined frequency offset/error over a single period of CK_local (in module 216), and then, in output module 217, accumulates that phase and outputs signal(s) (nano_s_adj and f_comp_en) instructing a timer count adjustment when it rises to a sufficient level. Combining the adjustments based on frequency offset and phase offset results in a final nanosecond-based-adjusted counter value phc_cnt.

In FIG. 4, there is another option to set a specific frequency offset in PPM units directly from the host (fo_sw) if the timer is configured as master mode. By the given value, it shares same frequency offset compensation logic instead of having separate one. Reference pulse 1 in FIG. 4 works together with frequency offset detection and gathers the relative frequency offset comparing to master. It's a coarse offset compensation which denotes to handle massive time adjustment into small incremental compensation to prevent big jump of timer. On the other hand, joint tracking in FIG. 6, including phase tracking and residual frequency offset tracking, fine-tunes the timer according to the residual time phase drifting obtained by reference pulse 2.

As noted above, the preferred architecture of unified-adaptive timer is capable to satisfy PTP and IEEE 802.11v. To support wireless time synchronization the IEEE 802.11v TM (Time Management) frames preferably carry 10 ns-resolution timestamping in transmission. Therefore, the unified-adaptive timer provides a clock-cycle based counter at the base of wireless timestamping and then upscales the clock-cycle timer to 10 nanosecond (ns) units by software to meet the requirement of the frame. The clock-cycle timer preferably also utilizes the same adjustments based on real-time frequency offset and phase tracking. The real-time conversion preferably provides clock-cycle compensation according to nanosecond adjustments. Hence, the wireless timestamping is seen as a nanosecond-resolution timer in 10 ns unit representation.

The following illustrates the foregoing real-time conversion, assuming a CK_local cycle period of 3.125 nanoseconds (ns) or, equivalently, a frequency of 320 MHz (megahertz). The increment adjustment from frequency offset, nano_s_adj, is the value of +/−1. That value preferably is converted to cycle units by using the phc_cnt_carry3 and phc_cnt_carry8 counters, as follows:

phc_cnt_carry3: +/−3 counter according to nano_s_adj and phc_cnt_carry8.

phc_cnt_carry8: +/−8 counter if phc_cnt_carry3 equals to +/−3.

The tracking phase offset is a small value, which is practical to covert without precision loss in one cycle.

acc_phase_offset=phase_offset+phase_offset_rsdl phase_offset_cvt=acc_phase_offset/3.125//round down to integer The residual phase offset is added to next conversion phase_offset_rsdl=acc_phase_offset−phase_offset_cvt*3.125

Finally, the cycle unit timer catches up the nanosecond adjustment by configuring phc_cnt_carry3 and phase_offset_cvt per cycle with less than 2 nanosecond deviations, and all the nanosecond controls are completely shared with the cycle-based timer. Furthermore, there preferably is an option to start dynamic alignment for double-sided check and compensation if the nanosecond-based counter and clock-cycle counter have unexpected drifting.

Figure 7:
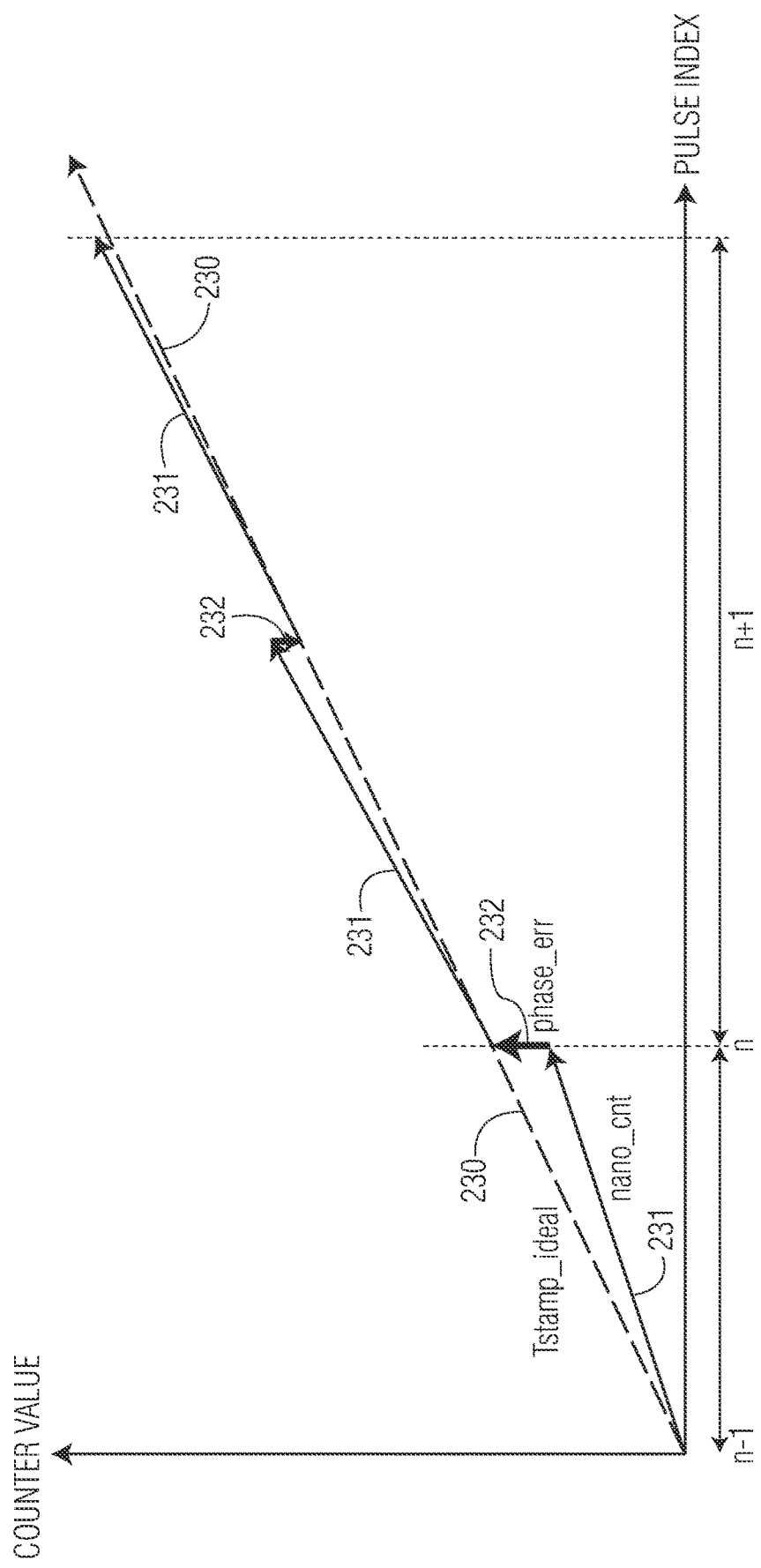
FIG. 7 is a graph illustrating the result of joint tracking according to a representative embodiment of the present invention.

Preferably, only phase tracking is continued (i.e., with no application of residual frequency offset) when the final frequency offset reaches the desired accuracy after tracking. This technique allows the frequency offset to approach a stable value, rather than having an uncertain jump that would result from the phase tracking (using reference pulse 2 in the current embodiment). Hence, the present approach can provide a smooth convergence and high-accuracy compensation, as illustrated in FIG. 7 (which shows the ideal timestamp 230 in relation to the actual timer count 231, as well as the corresponding phase time adjustments 232), and results in an ideal timer at each step.

System Environment.

Generally speaking, each of the units, modules or blocks discussed above and/or shown in the drawings (such terms being interchangeable herein) preferably is a special-purpose machine, implemented entirely in hardware and designed, e.g., using a hardware description language (HDL). In alternate embodiments, however, general-purpose programmable devices instead (or in addition) are used. In general, it should be noted that, except as expressly noted otherwise, any of the functionality described above can be implemented by dedicated (e.g., logic-based) hardware, by a general-purpose processor executing software and/or firmware, or any combination of these approaches, with the particular implementation being selected based on known engineering tradeoffs. More specifically, where any process and/or functionality described above is implemented in a fixed, predetermined and/or logical manner, it can be accomplished by a processor executing programming (e.g., software or firmware), an appropriate arrangement of logic components (hardware), or any combination of the two, as will be readily appreciated by those skilled in the art. In other words, it is well-understood how to convert logical and/or arithmetic operations into instructions for performing such operations within a processor and/or into logic gate configurations for performing such operations; in fact, compilers typically are available for both kinds of conversions.

It should be understood that the present invention also relates to machine-readable tangible (or non-transitory) media on which are stored software or firmware program instructions (i.e., computer-executable process instructions) for performing the methods and functionality and/or for implementing the modules and components of this invention. Such media include, by way of example, magnetic disks, magnetic tape, optically readable media such as CDs and DVDs, or semiconductor memory such as various types of memory cards, USB flash memory devices, solid-state drives, etc. In each case, the medium may take the form of a portable item such as a miniature disk drive or a small disk, diskette, cassette, cartridge, card, stick etc., or it may take the form of a relatively larger or less-mobile item such as a hard disk drive, ROM or RAM provided in a computer or other device. As used herein, unless clearly noted otherwise, references to computer-executable process steps stored on a computer-readable or machine-readable medium are intended to encompass situations in which such process steps are stored on a single medium, as well as situations in which such process steps are stored across multiple media.

Additional Considerations.

As used herein, the term "coupled", or any other form of the word, is intended to mean either directly connected or connected through one or more other components, elements or processing blocks, e.g., for the purpose of preprocessing. In the drawings and/or the discussions of them, where individual steps, components, modules or processing blocks are shown and/or discussed as being directly connected to each other, such connections should be understood as couplings, which may include additional steps, components, modules, elements and/or processing blocks. Unless otherwise expressly and specifically stated otherwise herein to the contrary, references to a signal herein mean any processed or unprocessed version of the signal. That is, specific processing steps discussed and/or claimed herein are not intended to be exclusive; rather, intermediate processing may be performed between any two processing steps expressly discussed or claimed herein, except to the extent expressly stated otherwise.

As used herein, the term "attached", or any other form of the word, without further modification, is intended to mean directly attached, attached through one or more other intermediate elements or components, or integrally formed together. In the drawings and/or the discussion, where two individual components or elements are shown and/or discussed as being directly attached to each other, such attachments should be understood as being merely exemplary, and in alternate embodiments the attachment instead may include additional components or elements between such two components. Similarly, method steps discussed and/or claimed herein are not intended to be exclusive; rather, intermediate steps may be performed between any two steps expressly discussed or claimed herein.

Whenever a specific value is mentioned herein, such a reference is intended to include that specific value or substantially or approximately that value. In this regard, the foregoing use of the word "substantially" is intended to encompass values that are not substantially different from the stated value, i.e., permitting deviations that would not have substantial impact within the identified context. For example, stating that a continuously variable signal level is set to a particular value should be understood to include values within a range around such specifically stated value that produce substantially the same effect as the specifically stated value. For example, the identification of a single length, width, depth, thickness, etc. should be understood to include values within a range around such specifically stated value that produce substantially the same effect as the specifically stated value. As used herein, except to the extent expressly and specifically stated otherwise, the term "approximately" can mean, e.g.: within ±10% of the stated value or within ±20% of the stated value.

In the preceding discussion, the terms "operators", "operations", "functions" and similar terms refer to method or process steps or to hardware components, depending upon the particular implementation/embodiment.

Unless clearly indicated to the contrary, words such as "optimal", "optimize", "maximize", "minimize", "best", as well as similar words and other words and suffixes denoting comparison, in the above discussion are not used in their absolute sense. Instead, such terms ordinarily are intended to be understood in light of any other potential constraints, such as user-specified constraints and objectives, as well as cost and processing or manufacturing constraints.

In the above discussion, certain methods are explained by breaking them down into steps listed in a particular order. Similarly, certain processing is performed by showing and/or describing modules arranged in a certain order. However, it should be noted that in each such case, except to the extent clearly indicated to the contrary or mandated by practical considerations (such as where the results from one step are necessary to perform another), the indicated order is not critical but, instead, that the described steps and/or modules can be reordered and/or two or more of such steps (or the processing within two or more of such modules) can be performed concurrently.

References herein to a "criterion", "multiple criteria", "condition", "conditions" or similar words which are intended to trigger, limit, filter or otherwise affect processing steps, other actions, the subjects of processing steps or actions, or any other activity or data, are intended to mean "one or more", irrespective of whether the singular or the plural form has been used. For instance, any criterion or condition can include any combination (e.g., Boolean combination) of actions, events and/or occurrences (i.e., a multipart criterion or condition).

Similarly, in the discussion above, functionality sometimes is ascribed to a particular module or component. However, functionality generally may be redistributed as desired among any different modules or components, in some cases completely obviating the need for a particular component or module and/or requiring the addition of new components or modules. The precise distribution of functionality preferably is made according to known engineering tradeoffs, with reference to the specific embodiment of the invention, as will be understood by those skilled in the art.

As used herein, the words "include", "includes", "including", and all other forms of the word should not be understood as limiting, but rather any specific items following such words should be understood as being merely exemplary.

Several different embodiments of the present invention are described above and/or in any documents incorporated by reference herein, with each such embodiment described as including certain features. However, it is intended that the features described in connection with the discussion of any single embodiment are not limited to that embodiment but may be included and/or arranged in various combinations in any of the other embodiments as well, as will be understood by those skilled in the art.

Thus, although the present invention has been described in detail with regard to the exemplary embodiments thereof and accompanying drawings, it should be apparent to those skilled in the art that various adaptations and modifications of the present invention may be accomplished without departing from the intent and the scope of the invention. Accordingly, the invention is not limited to the precise embodiments shown in the drawings and described above. Rather, it is intended that all such variations not departing from the intent of the invention are to be considered as within the scope thereof, as limited solely by the claims appended hereto.

What is claimed is:

1. A time-synchronization apparatus, comprising:
   inputs for receiving a reference pulse train and a local clock signal;
   a frequency offset acquisition and compensation (FOAC) module configured to identify a frequency offset by implementing a frequency-offset-acquisition process which includes counting cycles of the local clock signal within a period of the reference pulse train; and
   a joint phase and residual frequency offset tracking (JPRFOT) module configured to determine a phase offset of the local clock signal, output the phase offset, generate a residual frequency error based on the phase offset, and provide the residual frequency error to the FOAC module,
   wherein the FOAC module is further configured to generate at least one timer-adjustment signal based on the frequency offset and the residual frequency error and output said at least one timer-adjustment signal;
   wherein the phase offset of the local clock signal is determined in reference to a second reference pulse train; and
   wherein the second reference pulse train has a frequency of at least 10 times the frequency of the reference pulse train.

2. A time-synchronization apparatus according to claim 1, wherein the second reference pulse train has a frequency of at least 100 times the frequency of the reference pulse train.

3. A time-synchronization apparatus according to claim 1, wherein the phase offset is determined by measuring a timing differential between an expected time and a current measured time, and wherein the expected time is equal to a sum of a previous time and an amount of time that should have elapsed since the previous time based on a period of the second reference pulse train.

4. A time-synchronization apparatus according to claim 1, wherein the frequency-offset-acquisition process comprises counting cycles of the local clock signal within different periods of the reference pulse train until a stable-frequency-offset criterion is satisfied.

5. A time-synchronization apparatus according to claim 4, wherein the stable-frequency-offset criterion comprises a condition that detected frequency offsets determined from two consecutive detections are identical.

6. A time-synchronization apparatus according to claim 4, wherein upon satisfaction of the stable-frequency-offset criterion, the frequency-offset-acquisition process is halted, and a resulting stabilized frequency offset is used as the frequency offset thereafter.

7. A time-synchronization apparatus according to claim 1, further comprising an adaptive timer module that receives the phase offset and the at least one timer-adjustment signal and modifies its output based on said phase offset and said at least one timer-adjustment signal.

8. A time-synchronization apparatus according to claim 7, wherein the adaptive timer module is configured to add a specified number of nanoseconds within a period when appropriate and to subtract a specified number of nanoseconds within a period when appropriate, in response to the phase offset and the at least one timer-adjustment signal.

9. A time-synchronization method, comprising:
   identifying a frequency offset by implementing a frequency-offset-acquisition process which includes counting cycles of a local clock signal within a period of a reference pulse train;
   determining a phase offset of the local clock signal;
   generating a residual frequency error based on the phase offset; and
   providing at least one timer-adjustment signal that is based on the frequency offset and the residual frequency error;
   wherein the frequency-offset-acquisition process comprises counting cycles of the local clock signal within different periods of the reference pulse train until a stable-frequency-offset criterion is satisfied; and
   wherein the stable-frequency-offset criterion comprises a condition that detected frequency offsets determined from two consecutive detections are identical.

10. A time-synchronization method according to claim 9, wherein the phase offset of the local clock signal is determined in reference to a second reference pulse train.

11. A time-synchronization method according to claim 10, wherein the second reference pulse train has a frequency of at least 10 times the frequency of the reference pulse train.

12. A time-synchronization method according to claim 10, wherein the second reference pulse train has a frequency of at least 100 times the frequency of the reference pulse train.

13. A time-synchronization method according to claim 10, wherein the phase offset is determined by measuring a timing differential between an expected time and a current measured time, and wherein the expected time is equal to a sum of a previous time and an amount of time that should have elapsed since the previous time based on a period of the second reference pulse train.

14. A time-synchronization method according to claim 9, wherein upon satisfaction of the stable-frequency-offset criterion, the frequency-offset-acquisition process is halted, and a resulting stabilized frequency offset is used as the frequency offset thereafter.

15. A time-synchronization method according to claim 9, further comprising a step of modifying an output of an adaptive timer based on the phase offset and the at least one timer-adjustment signal.

16. A time-synchronization method according to claim 9, wherein said step of modifying comprises adding a specified number of nanoseconds within a period when appropriate and subtracting a specified number of nanoseconds within a period when appropriate, in response to the phase offset and the at least one timer-adjustment signal.

17. A time-synchronization apparatus, comprising:
inputs for receiving a reference pulse train and a local clock signal;
a frequency offset acquisition and compensation (FOAC) module configured to identify a frequency offset by implementing a frequency-offset-acquisition process which includes counting cycles of the local clock signal within a period of the reference pulse train; and
a joint phase and residual frequency offset tracking (JPR-FOT) module configured to determine a phase offset of the local clock signal, output the phase offset, generate a residual frequency error based on the phase offset, and provide the residual frequency error to the FOAC module,
wherein the FOAC module is further configured to generate at least one timer-adjustment signal based on the frequency offset and the residual frequency error and output said at least one timer-adjustment signal;
wherein the frequency-offset-acquisition process comprises counting cycles of the local clock signal within different periods of the reference pulse train until a stable-frequency-offset criterion is satisfied; and
wherein upon satisfaction of the stable-frequency-offset criterion, the frequency-offset-acquisition process is halted, and a resulting stabilized frequency offset is used as the frequency offset thereafter.

* * * * *